US010693475B1

(12) United States Patent
Gong et al.

(10) Patent No.: US 10,693,475 B1
(45) Date of Patent: Jun. 23, 2020

(54) GRADUAL FREQUENCY TRANSITION WITH A FREQUENCY STEP

(71) Applicant: Silicon Laboratories Inc., Austin, TX (US)

(72) Inventors: Xue-Mei Gong, Austin, TX (US); James D. Barnette, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/427,837

(22) Filed: May 31, 2019

(51) Int. Cl.
H03L 7/093 (2006.01)

(52) U.S. Cl.
CPC ................. H03L 7/093 (2013.01)

(58) Field of Classification Search
USPC ................. 327/147–149, 156–158
See application file for complete search history.

(56) References Cited

U.S. PATENT DOCUMENTS

| 5,349,310 | A  * | 9/1994  | Rieder ............... H03L 7/1806 331/18 |
| 6,590,426 | B2   | 7/2003  | Perrott |
| 6,711,230 | B1 * | 3/2004  | Nicholls .............. G04G 3/00 327/147 |
| 6,741,109 | B1   | 5/2004  | Huang et al. |
| 6,870,411 | B2 * | 3/2005  | Shibahara ........... H03L 7/0891 327/156 |
| 7,015,738 | B1 * | 3/2006  | Cao .................... H03C 3/0925 327/156 |
| 7,271,634 | B1 * | 9/2007  | Daga .................. H03L 7/0812 327/149 |
| 7,405,628 | B2   | 7/2008  | Hulfachor et al. |
| 7,417,510 | B2   | 8/2008  | Huang |
| 7,463,098 | B2   | 12/2008 | Baird et al. |
| 7,613,267 | B2   | 11/2009 | Perrott et al. |
| 7,777,585 | B1   | 8/2010  | Sonntag |
| 8,441,291 | B2   | 5/2013  | Hara et al. |
| 8,441,575 | B2   | 5/2013  | Wang |
| 8,514,118 | B2   | 8/2013  | Eldredge |
| 8,786,341 | B1   | 7/2014  | Weltin-Wu et al. |

(Continued)

OTHER PUBLICATIONS

Silicon Laboratories Inc., "Functional Description," Si5383/84 Rev D Data Sheet, Oct. 2018, 22 pages.

(Continued)

*Primary Examiner* — Adam A Houston
(74) *Attorney, Agent, or Firm* — Zagorin Cave LLP

(57) ABSTRACT

A method for generating a clock signal by a phase-locked loop includes generating a phase difference signal based on an input clock signal and a feedback clock signal and generating a loop filter output signal. In a first mode, the loop filter output signal is generated based on the phase difference signal and a predetermined frequency slope, and may include generating a phase-slope-limited version of the phase difference signal based on a predetermined phase slope limit and generating a frequency-slope-limited version of the phase difference signal based on the predetermined frequency slope limit. In a second mode, the loop filter output signal may be generated based on the predetermined frequency slope limit, a value of the loop filter output signal, and a target frequency. In the second mode, the loop filter output signal may be generated further based on a predetermined frequency step value.

19 Claims, 6 Drawing Sheets

(56) References Cited

U.S. PATENT DOCUMENTS

| | | | |
|---|---|---|---|
| 8,791,734 B1 | 7/2014 | Hara et al. | |
| 8,692,599 B2 | 8/2014 | Gong et al. | |
| 9,705,514 B2 | 7/2017 | Perrott | |
| 10,067,478 B1 | 9/2018 | Ranganathan | |
| 10,075,173 B2 | 9/2018 | Sarda | |
| 2002/0044620 A1* | 4/2002 | Spijker | H03L 7/085 375/371 |
| 2003/0025538 A1* | 2/2003 | Bisanti | H03L 7/0893 327/156 |
| 2005/0258908 A1* | 11/2005 | Mitric | H03L 7/093 331/16 |
| 2007/0024383 A1* | 2/2007 | Spijker | H03L 7/107 331/34 |
| 2007/0182467 A1* | 8/2007 | Nakamuta | H03L 1/022 327/156 |
| 2009/0052602 A1* | 2/2009 | Annampedu | H03L 7/093 375/376 |
| 2010/0073048 A1* | 3/2010 | Ke | H03L 7/0898 327/157 |
| 2010/0158051 A1* | 6/2010 | Hadzic | H03L 7/085 370/503 |
| 2010/0158181 A1* | 6/2010 | Hadzic | H03L 7/085 375/371 |
| 2010/0158183 A1* | 6/2010 | Hadzic | H03L 7/087 375/376 |
| 2011/0007859 A1* | 1/2011 | Ueda | H03L 7/0802 375/376 |
| 2012/0049913 A1* | 3/2012 | Tadjpour | H03L 7/104 327/157 |
| 2012/0249195 A1* | 10/2012 | Guo | H03L 7/103 327/156 |
| 2013/0057325 A1* | 3/2013 | Dong | H03L 7/08 327/147 |
| 2013/0106476 A1* | 5/2013 | Joubert | H03L 1/00 327/156 |
| 2014/0118033 A1 | 5/2014 | Anker et al. | |
| 2014/0320186 A1* | 10/2014 | Jin | H03L 7/1075 327/159 |
| 2015/0222273 A1 | 8/2015 | Allan et al. | |
| 2015/0222274 A1* | 8/2015 | Cenger | G06F 1/10 327/156 |
| 2016/0065224 A1* | 3/2016 | Galton | H03L 7/093 327/157 |
| 2016/0099716 A1* | 4/2016 | Kobayashi | H03L 7/0994 327/115 |
| 2017/0187481 A1 | 6/2017 | Huang et al. | |
| 2019/0007055 A1* | 1/2019 | Nelson | G06F 1/10 |

OTHER PUBLICATIONS

Silicon Laboratories Inc., "AN1006: Diffrences Between Si534x/8x Revision B and Revision D Silicon," Data Sheet, Nov. 3, 2016, 8 pages.

Shenoi, K., "An Introduction to Synchronization and Timing in Telecommunications," Qulsar Clocks, Oscillators, and PLLs, WSTS-2013, San Jose, Apr. 16-18, 2013, 73 pages.

* cited by examiner

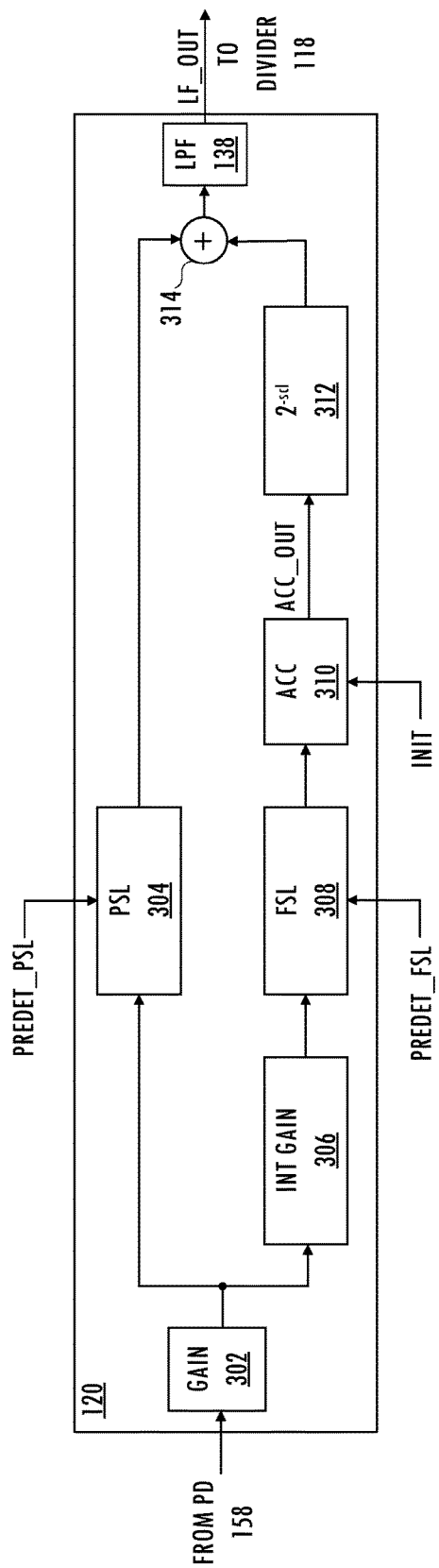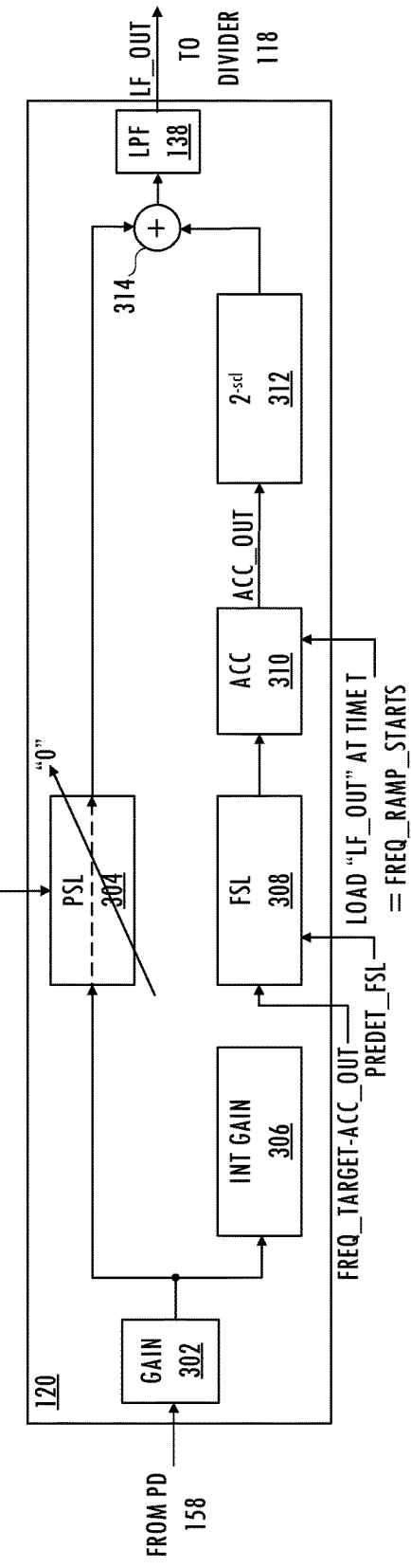

GRADUAL FREQUENCY TRANSITION WITH A FREQUENCY STEP

BACKGROUND

Field of the Invention

This invention relates to integrated circuits and more particularly to clock generator integrated circuits.

Description of the Related Art

High speed communication systems require high speed clock signals for transmission and reception of information. In a typical clock generation circuit, a phase-locked loop (PLL) receives a synchronization input reference clock signal and generates one or more high speed clock signals suitable for use in transmitting or receiving data. According to one aspect of such a communication system, when the synchronization input reference clock signal is lost, the system enters a mode known as "holdover" mode and continues to output a clock signal.

The accuracy with which the clock generation circuit provides the clock signal in holdover mode is typically specified in a system standard for a target application. The clock generation circuit tries to maintain the output clock signal during holdover mode at a frequency based on a previous reference clock signal. When switching from a free running clock signal to a locked clock signal, entering into a holdover mode, exiting from a holdover mode, or switching an input clock signal from one clock source to another clock source, an application may require that the frequency and phase of output clock signal change in a controlled manner. Some applications specify a phase slope limit and a frequency slope limit for the output clock signal. An exemplary specification requires that the maximum rate of frequency change during a pull-in process (i.e., the process of locking a clock signal to another clock signal) is limited to a predetermined value. For example, a specification for a target application has a frequency slope limit of 2.9 ppm/second for a measurement interval of 1 second. However, in some circumstances, satisfying the frequency slope limit specification causes the pull-in process to take a substantial amount of time and causes substantial phase build-up. Accordingly, techniques that reduce the time to complete the clock pull-in process and reduce the phase build-up of a clock generator circuit in response to an event while satisfying change specifications for the output clock signal are desired.

SUMMARY OF EMBODIMENTS OF THE INVENTION

In at least one embodiment, a method for generating a clock signal by a phase-locked loop includes generating a phase difference signal based on an input clock signal and a feedback clock signal. The method includes generating a loop filter output signal. In a first mode of operation, the loop filter output signal is generated based on the phase difference signal and a predetermined frequency slope limit. The clock signal is generated based on the loop filter output signal. In the first mode of operation, generating the loop filter output signal may include generating a phase-slope-limited version of the phase difference signal based on a predetermined phase slope limit, and generating a frequency-slope-limited version of the phase difference signal based on the predetermined frequency slope limit. The loop filter output signal may be generated using the phase-slope-limited version of the phase difference signal and the frequency-slope-limited version of the phase difference signal. In a second mode of operation, the loop filter output signal may be generated based on the predetermined frequency slope limit, a value of the loop filter output signal, and a target frequency. In the second mode of operation, the loop filter output signal may be generated further based on a predetermined frequency step value.

In at least one embodiment, a phase-locked loop includes a phase-detector configured to generate a phase difference signal in response to an input clock signal and a feedback clock signal. The phase-locked loop includes a change-limiting loop filter. In a first mode of operation, the change-limiting loop filter is configured to generate a loop filter output signal based on a predetermined frequency slope limit and the phase difference signal. In a second mode of operation, the change-limiting loop filter may be configured to generate the loop filter output signal based on the predetermined frequency slope limit, a value of the loop filter output signal, and a target frequency. The change-limiting loop filter may include an accumulator configured to update contents of the accumulator with a combination of an operand and the contents of the accumulator and a frequency slope limiting circuit configured to provide the operand to the accumulator. In the second mode of operation, the operand may be based on the predetermined frequency slope limit and the target frequency. The change-limiting loop filter may include a low-pass filter configured to generate the loop filter output signal based on the contents of the accumulator in the second mode of operation.

In at least one embodiment, a method for operating a phase-locked loop includes, in response to an event, gradually changing a frequency of an output clock signal generated by the phase-locked loop from a first frequency to a second frequency. The frequency is gradually changed at a rate less than or equal to a predetermined frequency slope limit. The first frequency is based on a prior frequency of the output clock signal and a predetermined frequency step value.

BRIEF DESCRIPTION OF THE DRAWINGS

The present invention may be better understood, and its numerous objects, features, and advantages made apparent to those skilled in the art by referencing the accompanying drawings.

FIG. 3 illustrates a functional block diagram of an exemplary change-limiting loop filter of the clock generator circuit of FIG. 2 configured in a first mode of operation consistent with at least one embodiment of the invention.

FIG. 4 illustrates a functional block diagram of an exemplary change-limiting loop filter of the clock generator circuit of FIG. 2 configured in a second mode of operation in response to an event consistent with at least one embodiment of the invention.

The use of the same reference symbols in different drawings indicates similar or identical items.

DETAILED DESCRIPTION

Figure 1:
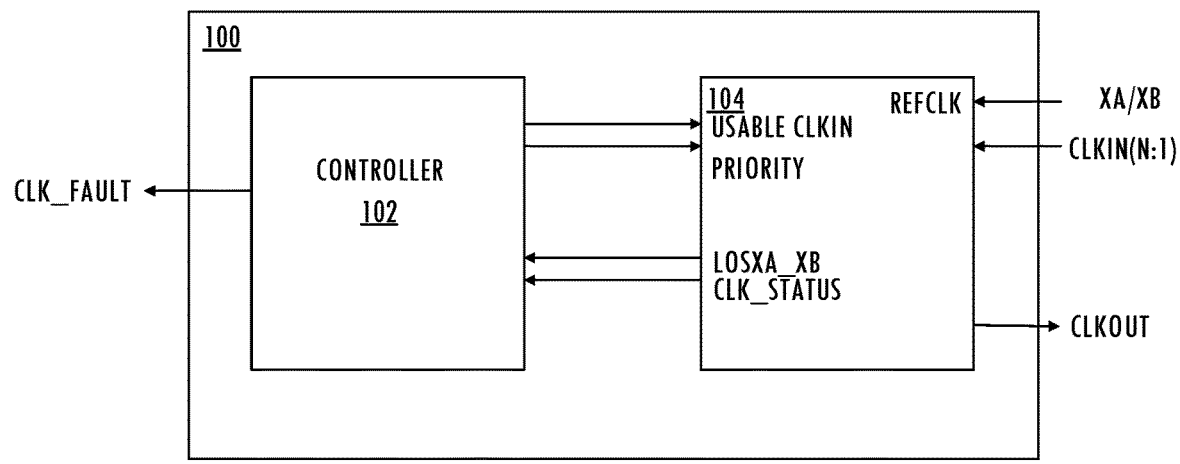
FIG. 1 illustrates a functional block diagram of an exemplary clock product.

Referring to FIG. 1, an embodiment of clock product 100 includes controller 102 and clock generator 104, which monitors at least one received clock signal (e.g., CLKIN(N:1)) using clock signal REFCLK (e.g., a clock signal generated using a crystal oscillator including an external crystal coupled to XA/XB input terminal) and provides at least one output clock signal CLKOUT and at least one clock quality signal. Controller 102 provides configuration information to clock generator 104 using interface signals USABLE_CLKIN and PRIORITY. Clock generator 104 provides clock quality information (e.g., LOSXA_XB or CLK_STATUS) to controller 102, which outputs one or more alarm signals (e.g., CLK_FAULT) based on the clock quality information.

Figure 2:
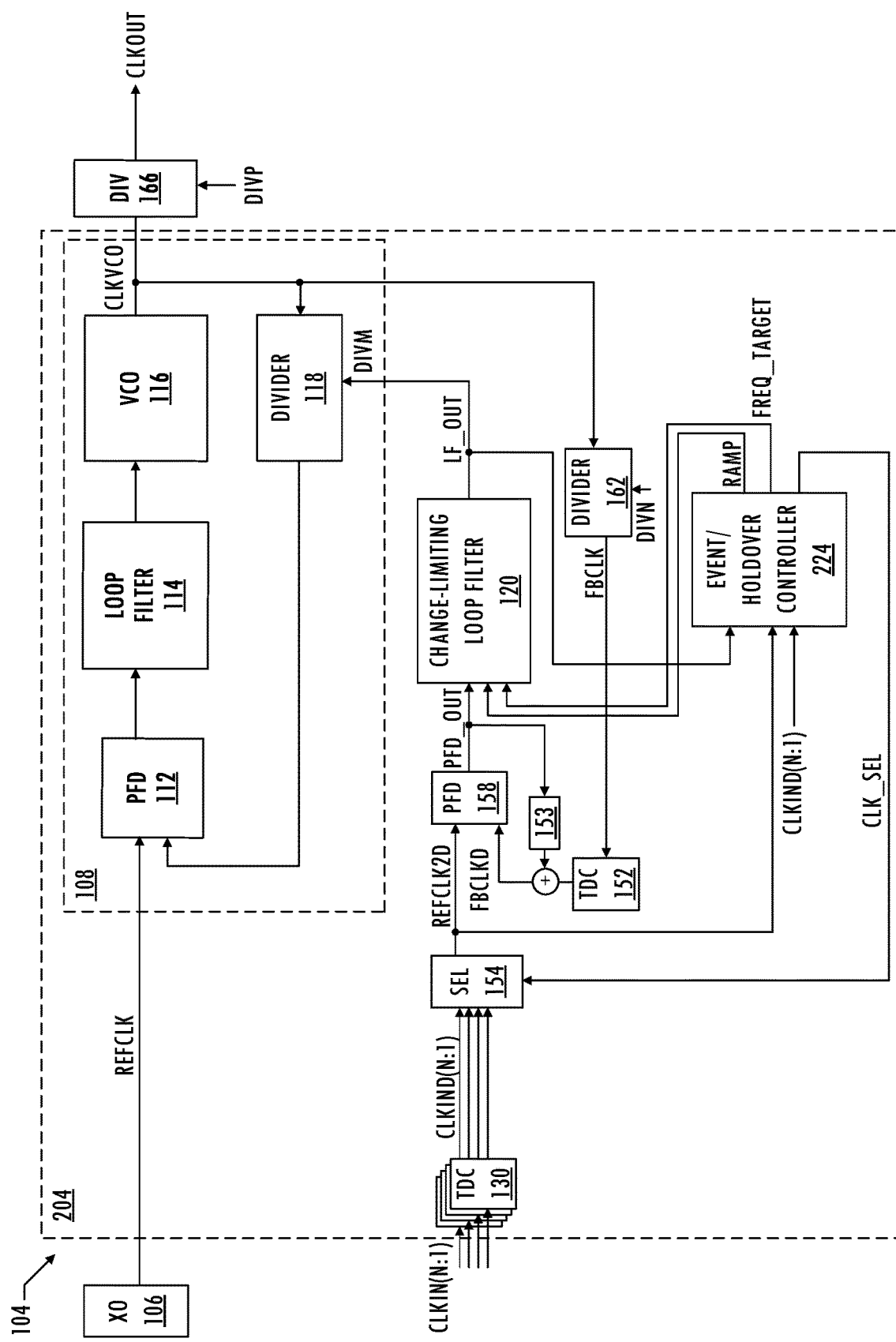
FIG. 2 illustrates a functional block diagram of an exemplary clock generator circuit including a change-limiting loop filter consistent with at least one embodiment of the invention.
Figure 7:
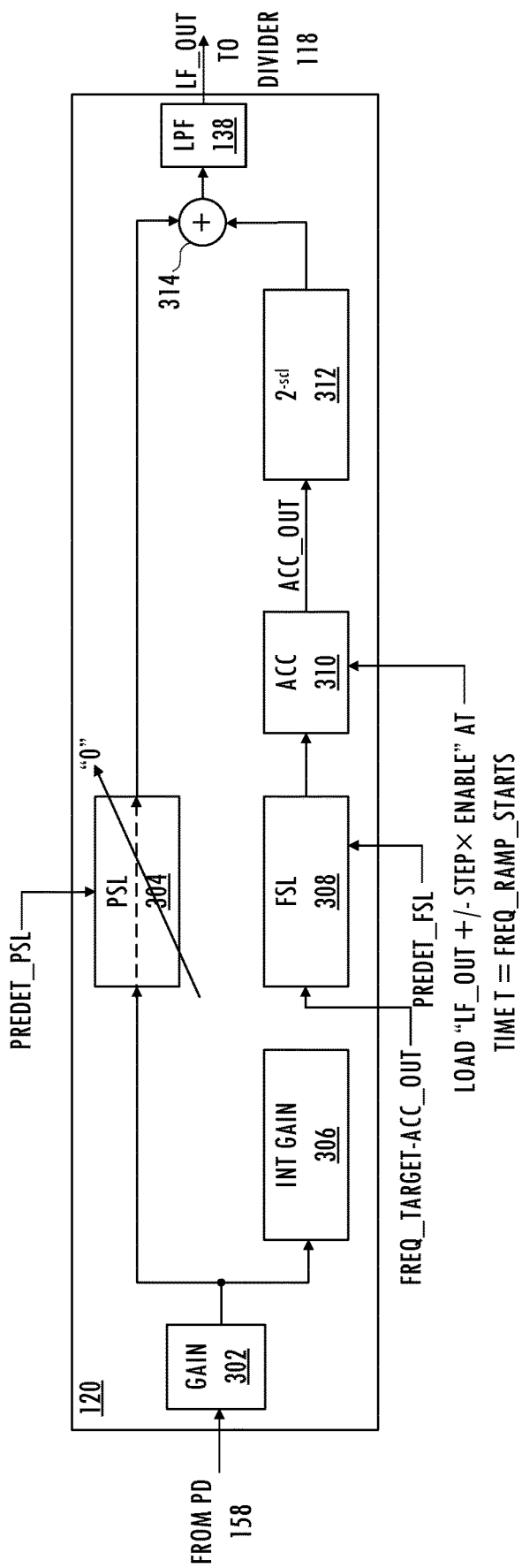
FIG. 7 illustrates a functional block diagram of an exemplary change-limiting loop filter implementing a gradual frequency increase with a frequency step of an output clock signal of FIG. 2 consistent with at least one embodiment of the invention.

FIG. 2 illustrates a functional block diagram of an exemplary clock generator circuit including a change-limiting loop filter. In at least one embodiment, clock generator 104 includes a dual-loop phase-locked loop that generates output clock signal CLKOUT having low jitter, by locking to an input clock signal (e.g., a clock signal selected from input clock signals CLKIN(N:1)) using inner phase-locked loop 108, which is configured as a low-jitter, digitally-controlled oscillator. In an embodiment, reference clock source 106 is a fixed source such as a crystal oscillator, a microelectromechanical structure (MEMS) oscillator, or other suitable low-jitter source. Inner phase-locked loop 108, includes phase/frequency detector 112, which generates a phase difference signal based on reference clock signal REFCLK and a feedback signal provided by divider 118. Phase/frequency detector 112 provides the phase difference signal to voltage-controlled oscillator 116 via loop filter 114. Voltage-controlled oscillator 116 may be implemented as a ring oscillator, an LC oscillator, or other suitable oscillator structure.

Outer phase-locked loop 204 includes time-to-digital converters 130 that generate clock signals CLKIND(N:1), which are digital representations of input clock signals CLKIN(N:1). Select circuit 154 selects one of those digital input clock signals according to control signal CLK_SEL and provides the selected digital input clock signal to phase/frequency detector 158 as clock signal REFCLK2D, which serves as a digital reference clock signal for outer phase-locked loop 204. Outer phase-locked loop 204 includes phase/frequency detector 158, change-limiting loop filter 120, and divider 162, and uses inner phase-locked loop 108 as a digitally controlled oscillator responsive to digital divider ratio DIVM, which is an integer divider value or a fractional divider value. Phase/frequency detector 158 receives clock signal REFCLK2D and feedback clock signal FBCLKD. Time-to-digital converter 152 provides feedback clock signal FBCLKD, which is a digital version of feedback clock signal FBCLK. Feedback clock signal FBCLK is a frequency-divided version of clock signal CLKVCO. Phase/frequency detector 158 provides a phase error signal generated based on the difference between clock signal REFCLK2D and feedback clock signal FBCLKD. In at least one embodiment, phase/frequency detector 158 is a digital phase detector that provides a digital difference signal to change-limiting loop filter 120, which generates loop filter output signal LF_OUT. Change-limiting loop filter 120 provides loop filter output signal LF_OUT to inner loop 108 as divider ratio DIVM that controls divider 118. In at least one embodiment, time-to-digital converters 130 and 152 are implemented using techniques described in U.S. Pat. No. 10,067,478, issued Sep. 4, 2018, entitled "Use of a Recirculating Delay Line with a Time-to-Digital Converter," naming Raghunandan Kolar Ranganathan as inventor, which application is incorporated herein by reference.

The frequency of reference clock signal REFCLK and divider ratio DIVM provided by outer phase-locked loop 204 to divider 118 in the feedback path of inner phase-locked loop 108 determine the frequency of clock signal CLKVCO. Outer phase-locked loop 204 adjusts divider ratio DIVM to match the frequency of clock signal CLKVCO ($f_{CLKVCO}$) to a multiple (divider ratio DIVN) of the frequency of the selected input clock signal of input clock signals CLKIN(N:1) (e.g., $f_{CLKIN(n)}=f_{CLKVCO}/\text{DIVN}$, where $f_{CLKIN(n)}$ is the frequency of selected input clock signal CLKIN(n), which corresponds to clock signal REFCLK2D). In an embodiment of clock generator 104, outer phase-locked loop 204 provides clock signal CLKVCO to output divider 166, which is responsive to divider control signal DIVP. In at least one embodiment of output divider 166, divider control signal DIVP is a digital frequency ratio translated from a code, e.g., a code provided by non-volatile memory or other storage element. In other embodiments of clock generator 104, voltage-controlled oscillator 116 provides clock signal CLKVCO as output clock signal CLKOUT and output divider 166 is disabled or excluded.

In at least one embodiment of clock generator 104, event/holdover controller 224 determines whether selected input clock signal CLKIN(n), which is selected from input clock signals CLKIN(N:1) and digitized by time-to-digital converters 130, exists and/or whether the frequency of selected input clock signal CLKIN(n) is within a target frequency range. If the frequency of selected input clock signal CLKIN(n) is out of the target frequency range, a loss-of-signal condition is detected, or a substantial phase difference is detected, event/holdover controller 224 determines that selected input clock signal CLKIN(n) is invalid. If selected input clock signal CLKIN(n) is invalid and event/holdover controller 224 determines that no other input clock signals are valid, event/holdover controller 224 triggers the holdover mode. Event/holdover controller 224 freezes loop output signal LF_OUT provided by change-limiting loop filter 120 to prevent divider ratio DIVM from tracking further changes to clock signal REFCLK2D, and selects a stored averaged output of change-limiting loop filter 120 or a stored value based on an output signal of change-limiting loop filter 120 as target value FREQ_TARGET provided as input to change-limiting loop filter 120, thereby holding the frequency of clock signal CLKVCO at a steady frequency value. For example, event/holdover control 224 of outer phase-locked loop 204 holds the output signal of change-limiting loop filter 120 at a value corresponding to an output of phase/frequency detector 158 received by change-limiting loop filter 120 prior to entering the holdover mode to prevent updating of DIVM. In at least one embodiment of clock generator 104, during holdover mode, event/holdover controller 224 provides change-limiting loop filter 120 with target value FREQ_TARGET that causes output clock signal CLKOUT to achieve a target frequency and is an average value or other function of a stored value of the output of phase/frequency detector 158. The stored value is stored prior to entering the holdover mode. Freezing divider ratio DIVM provided to divider 118 causes the output frequency of clock signal CLKVCO to vary only based on frequency variation of clock signal REFCLK. Meanwhile, event/holdover controller 224 also updates CLK_SEL to select an output of time-to-digital converters 130 to provide as selected input clock signal CLKIN(n) for use upon exiting the holdover mode.

In at least one embodiment, change-limiting loop filter 120 limits a phase change and a frequency change of an output clock signal in response to pull-in events (e.g., after a switch of the selected input clock signal from selected input clock signal CLKIN(n) to another of input clock signals CLKIN(N:1) by select circuit 154 or after the frequency of selected input clock signal CLKIN(n) changes abruptly). Target applications specify a maximum rate of frequency change and maximum rate of phase change of output clock signal CLKOUT during the pull-in process. An exemplary predetermined frequency slope limit PREDET_FSL is 2.9 ppm/second for a measurement interval of one second and an exemplary predetermined phase slope limit PREDET_PSL is 0.3125 µs/s within 164 ms. In response to a pull-in event, change-limiting loop filter 120 limits the rate of change in phase of output clock signal CLKOUT and limits the rate of change in frequency of output clock signal CLKOUT to cause the frequency of output clock signal CLKOUT to gradually transition between frequencies. FIG. 3 illustrates a functional block diagram of exemplary change-limiting loop filter 120. In at least one embodiment, change-limiting loop filter 120 includes gain circuit 302, which applies a gain factor to the output of phase/frequency detector 158 during closed-loop operation of clock generator 104. Phase slope limiter 304 compares the gained phase difference signal to predetermined phase slope limit PREDET_PSL. If the gained phase difference signal is less than predetermined phase slope limit PREDET_PSL, phase slope limiter 304 provides the gained phase difference signal to summing circuit 314. If the gained phase difference signal is greater than predetermined phase slope limit PREDET_PSL, phase slope limiter 304 provides predetermined phase slope limit PREDET_PSL to summing circuit 314, thereby limiting the change in phase of output clock signal CLKOUT.

In a signal path that is coupled in parallel with phase slope limiter 304, integrator gain 306 applies another gain factor (e.g., a power of two) to the gained phase difference signal received from gain circuit 302. If the gained phase difference value is greater than predetermined frequency slope limit PREDET_FSL, frequency slope limiter 308 provides predetermined frequency slope limit PREDET_FSL to accumulator 310. If the gained phase difference value is less than predetermined frequency slope limit PREDET_FSL, frequency slope limiter 308 provides the gained phase difference signal to accumulator 310. In closed-loop operation, accumulator 310 sums values of the gained phase difference signal over time to obtain a frequency shift value. Scaler 312 adjusts the output of accumulator 310 and provides the scaled accumulator output to summing circuit 314 for combination with the output of phase slope limiter 304. Summing circuit 314 provides the resulting combination to low-pass filter 138, which low-pass filters the phase-change limited and frequency-change limited output signal to generate a corresponding digital control signal for inner loop 108. Event/holdover controller 224 updates a stored value based on the output of change-limiting loop filter 120 for later use during other modes of operation (e.g., an open-loop mode of operation).

Figure 5:
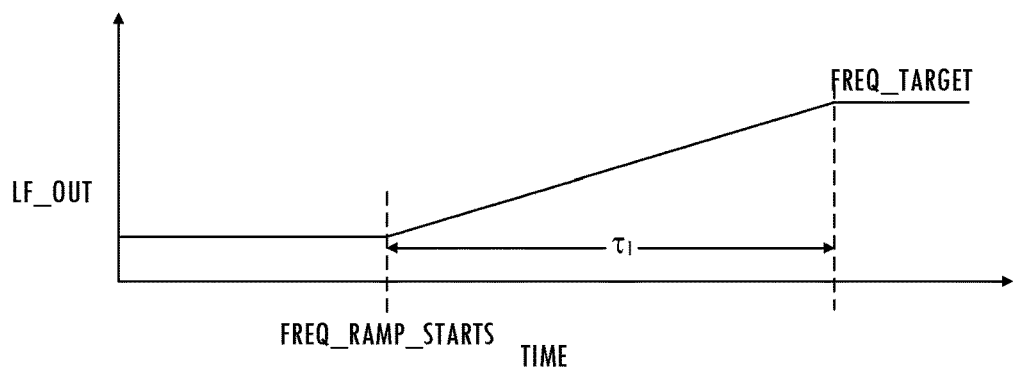
FIG. 5 illustrates an exemplary waveform for a loop filter output signal as a function of time generated by a change-limiting loop filter implementing a gradual frequency increase of an output clock signal of FIG. 2 consistent with at least one embodiment of the invention.

Referring to FIGS. 2, 4, and 5, in at least one embodiment, in response to detecting an event, event/holdover controller 224 configures outer phase-locked loop 204 in an open-loop configuration and enables a gradual transition (e.g., switching from a free running clock signal to a locked clock signal, entering into a holdover mode of operation, exiting from a holdover mode of operation, or switching an input clock signal from one clock source to another clock source providing another input clock signal having a different frequency). In response to control signal RAMP, outer phase-locked loop 204 gradually transitions output clock signal CLKOUT to a new frequency. In open-loop operation, when gradually transitioning the frequency of output clock signal CLKOUT, event/holdover controller 224 effectively disables phase slope limiter 304 (e.g., phase slope limiter 304 provides zero output or phase slope limiter 304 is decoupled from summing circuit 314). Change-limiting loop filter 120 gradually transitions the frequency of output clock signal CLKOUT from a current frequency of output clock signal CLKOUT to target value FREQ_TARGET based on selected input clock signal CLKIN(n) or based on a stored value corresponding to the historical input clock average frequency data for entering holdover mode. At the start of the gradual transition (i.e., time FREQ_RAMP_STARTS), event/holdover controller 224 loads accumulator 310 with a suitably scaled version of loop filter output LF_OUT.

Figure 6:
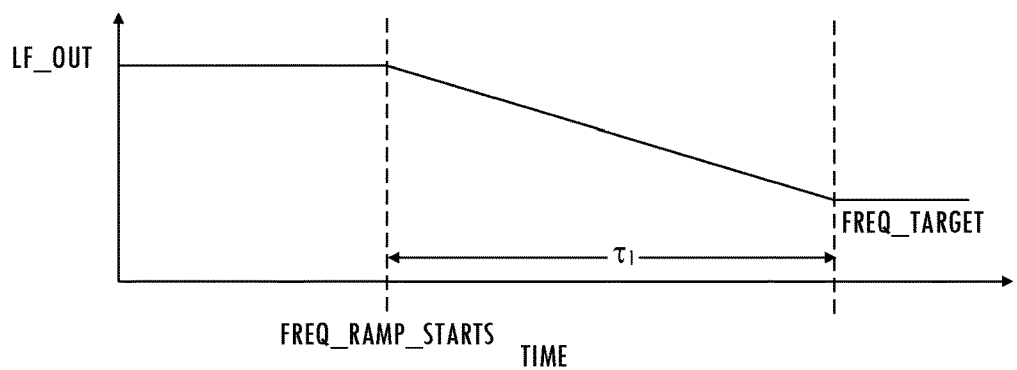
FIG. 6 illustrates an exemplary waveform for a loop filter output signal as a function of time generated by a change-limiting loop filter implementing a gradual frequency decrease of an output clock signal of FIG. 2 consistent with at least one embodiment of the invention.

During a gradual transition, event/holdover controller 224 continuously drives frequency slope limiter 308 with an updated difference between target value FREQ_TARGET and a signal corresponding to the frequency of the reference clock signal (e.g., output of accumulator 310). When the magnitude of the difference is greater than predetermined frequency slope limit PREDET_FSL, frequency slope limiter 308 provides the predetermined frequency slope limit PREDET_FSL as an operand to accumulator 310 until the magnitude of the difference is less than predetermined frequency slope limit PREDET_FSL. When the magnitude of the difference is less than predetermined frequency slope limit PREDET_FSL, frequency slope limiter 308 provides that difference to accumulator 310. When the frequency of selected input clock signal CLKIN(n) is greater than the frequency of feedback clock signal FBCLK, the output of the loop filter as a function of time gradually increases (e.g., linearly increases or monotonically increases) to target value FREQ_TARGET, as illustrated in FIG. 5. When the frequency of the input clock signal is less than the frequency of feedback clock signal FBCLK, the output of change-limiting loop filter 120 as a function of time gradually decreases to a lower target value FREQ_TARGET (e.g., linearly decreases or monotonically decreases), as illustrated in FIG. 6. For a predetermined frequency slope limit PREDET_FSL, transition time $\tau_1$ can be substantial and can cause a substantial phase build-up (i.e., a substantial constant phase difference).

A technique for reducing the transition time and phase build-up caused by a gradual phase or frequency transition includes introducing a frequency step at the beginning of the gradual transition, which is allowed by a specification of a target application. Referring to FIGS. 2, 7, 8, and 9, in at least one embodiment, in response to an event (e.g., switching from a free running clock signal to a locked clock signal, entering into a holdover mode of operation, exiting from a holdover mode of operation, or switching an input clock signal from one clock source to another clock source providing another input clock signal having a different frequency), event/holdover controller 224 configures outer phase-locked loop 204 in an open-loop configuration and enables a gradual frequency transition with a frequency step (e.g., sets step control signal ENABLE=='1'). Change-limiting loop filter 120 introduces the frequency step by initializing accumulator 310 at time FREQ_RAMP_STARTS with a combination of loop filter output LF_OUT and frequency step value STEP. Frequency step value STEP is added to loop filter output LF_OUT if the frequency transition increases the frequency of output clock signal CLKOUT and frequency step value STEP is subtracted from loop filter output LF_OUT if the frequency transition decreases the frequency of output clock signal CLKOUT. In at least one embodiment, frequency step value STEP has a predetermined value that corresponds to a frequency step with a magnitude less than or equal to phase slope limit PREDET_PSL. If frequency step value STEP is larger than the absolute value of loop filter output LF_OUT, accumulator 310 is loaded with target value FREQ_TARGET directly to avoid frequency overshoot. After initialization, which applies the frequency step value, if the target frequency has not been achieved by output clock signal CLKOUT, accumulator 310 applies the operand provided by frequency slope limiter 308. The sign of the applied operand is determined by change-limiting loop filter 120 based on the values of loop filter output LF_OUT and target value FREQ_TARGET. In at least one embodiment, the operand has a value that corresponds to frequency slope limit PREDET_FSL.

Figure 8:
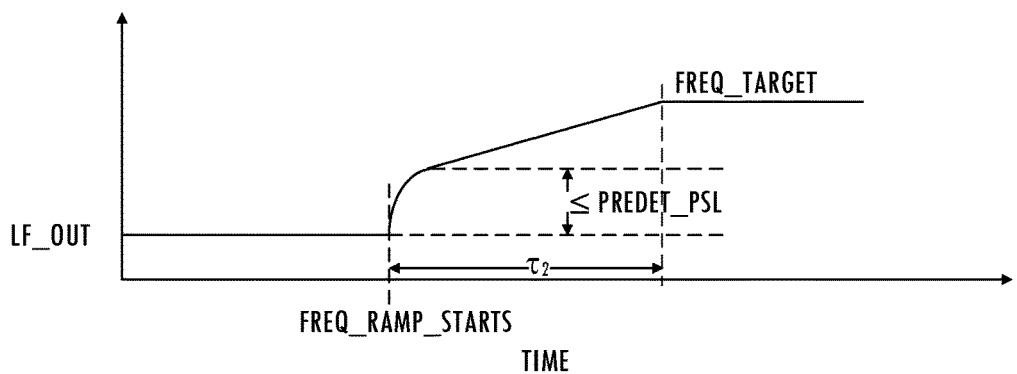
FIG. 8 illustrates an exemplary waveform for a loop filter output signal as a function of time generated by a change-limiting loop filter implementing a frequency step and gradual frequency increase of an output clock signal of FIG. 2 consistent with at least one embodiment of the invention.
Figure 9:
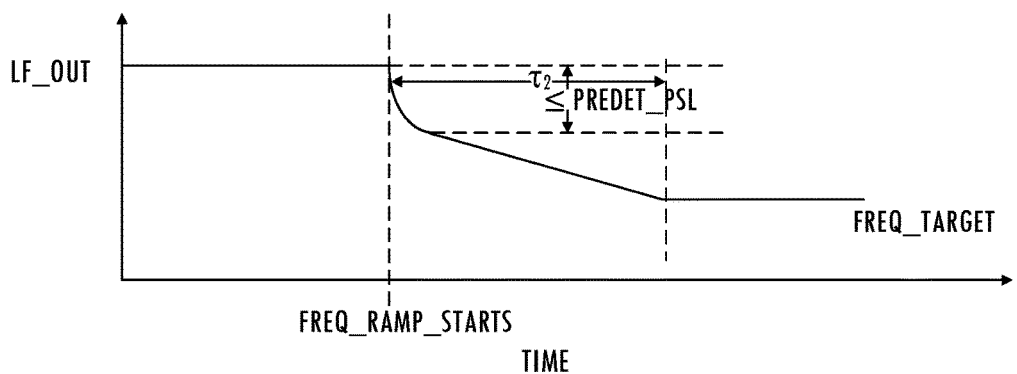
FIG. 9 illustrates an exemplary waveform for a loop filter output signal as a function of time generated by a change-limiting loop filter implementing a frequency step and gradual frequency decrease of an output clock signal of FIG. 2 consistent with at least one embodiment of the invention.

Since the output of accumulator 310 is indirectly coupled to low-pass filter 138, change-limiting loop filter 120 provides a nonlinear, but continuous signal to inner loop 108. FIG. 8 illustrates exemplary loop filter output as a function time in response to the target frequency being greater than the frequency of output clock signal CLKOUT (i.e., the current frequency) when the frequency transition is enabled. FIG. 9 illustrates exemplary loop filter output as a function time in response to the frequency of output clock signal CLKOUT being greater than the target frequency when the frequency transition is enabled. Referring to FIGS. 5, 6, 8 and 9, the transition time $\tau_2$ realized by a gradual frequency transition with a frequency step is substantially less than transition time $\tau_1$ realized by a gradual frequency transition without a frequency step and the frequency step introduces a nonlinear change in the loop filter output signal that has a magnitude less than or equal to a corresponding predetermined phase slope limit PREDET_PSL, and a linear transition with a slope less than or equal to predetermined frequency slope limit PREDET_FSL.

Figure 10:
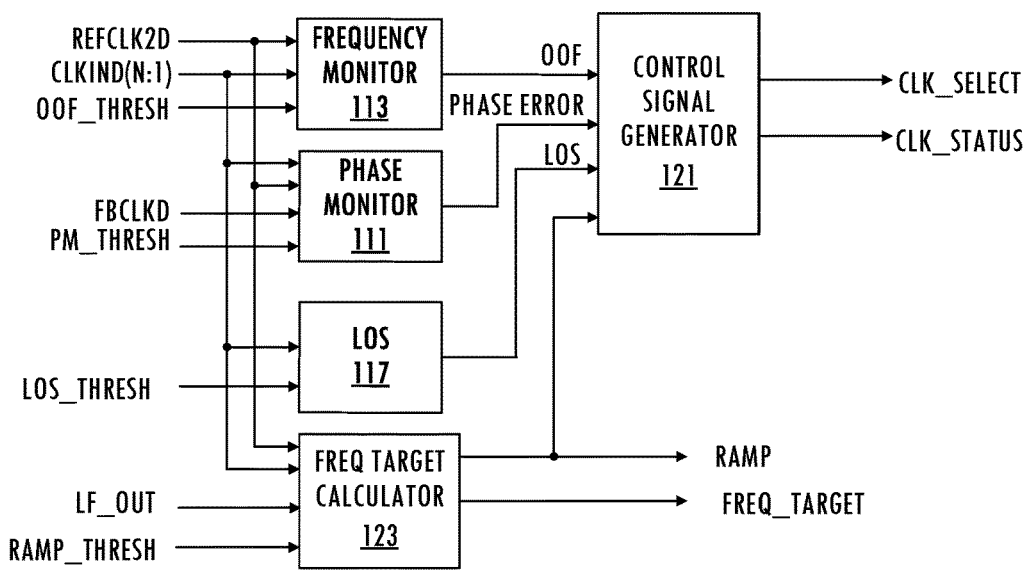
FIG. 10 illustrates a functional block diagram of an exemplary event/holdover controller of the clock generator of FIG. 2.

Referring to FIGS. 2 and 10, in at least one embodiment, clock generator 104 includes event/holdover controller 224, which detects events and generates control signals associated with those events. For example, in at least one embodiment of clock generator 104 event/holdover controller 224 monitors clock signal REFCLK2D and detects out-of-frequency (OOF) events, phase error events, and loss-of-signal (LOS) events and generates associated control signals (e.g., control signals to select a source to provide clock signal REFCLK2D, to enable holdover mode, disable holdover mode, or to enable gradual frequency transitioning). Frequency monitor 113 generates an indication of whether input clock signals CLKIN(N:1) have a frequency in the range associated with clock signal REFCLK2D based on corresponding digital values (e.g., clock signals CLKIND(N:1) and clock signal REFCLK2D) and a predetermined frequency difference threshold OOF_THRESH. If the frequency difference associated with selected input clock signal CLKIN(n) and clock signal REFCLK2D is greater than predetermined frequency difference threshold OOF_THRESH, frequency monitor indicates detection of an out-of-frequency event. Phase monitor 111 generates an indication of a phase error between the selected input clock signal CLKIN(n) and the feedback clock signal indicated by digital value REFCLK2D exceeding a predetermined phase difference threshold PM_THRESH.

Loss-of-signal detector 117 determines whether selected input clock signal CLKIN(n) is present based on clock signal REFCLK2D and threshold LOS_THRESH. If either the frequency of selected input clock signal CLKIN(n) is out of the target frequency range or a loss-of-signal condition is detected, control signal generator 121 generates corresponding control signals or an indication that selected input clock signal CLKIN(n) has failed. If event/holdover controller 224 detects an event and triggers holdover mode, frequency target calculator 123 generates target value FREQ_TARGET based on historical input clock average frequency data stored in a storage element. Event/holdover controller 224 configures change-limiting loop filter 120 for open-loop mode and provides target value FREQ_TARGET to change-limiting filter 120. Under some circumstances, instead of entering holdover mode in response to an event, event/holdover controller 224 updates clock select signal CLK_SEL to a next input clock signal, which may be the same clock signal or another clock signal received by select circuit 154. If event/holdover controller 224 detects an event and updates clock select signal CLK_SEL to switch the input clock signal to another valid clock signal received by select circuit 154, frequency target calculator 123 generates target value FREQ_TARGET based on the average frequency of selected input clock signal CLKIN(n). Event/holdover controller 224 configures change-limiting loop filter 120 for open-loop mode and provides target value FREQ_TARGET to change-limiting filter 120. If event/holdover controller 224 does not detect an event, event/holdover controller 224 configures change-limiting loop filter 120 to provide a dynamically updated output to inner phase-locked loop 108. In an embodiment, event/holdover controller 224 is implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

Figure 11:
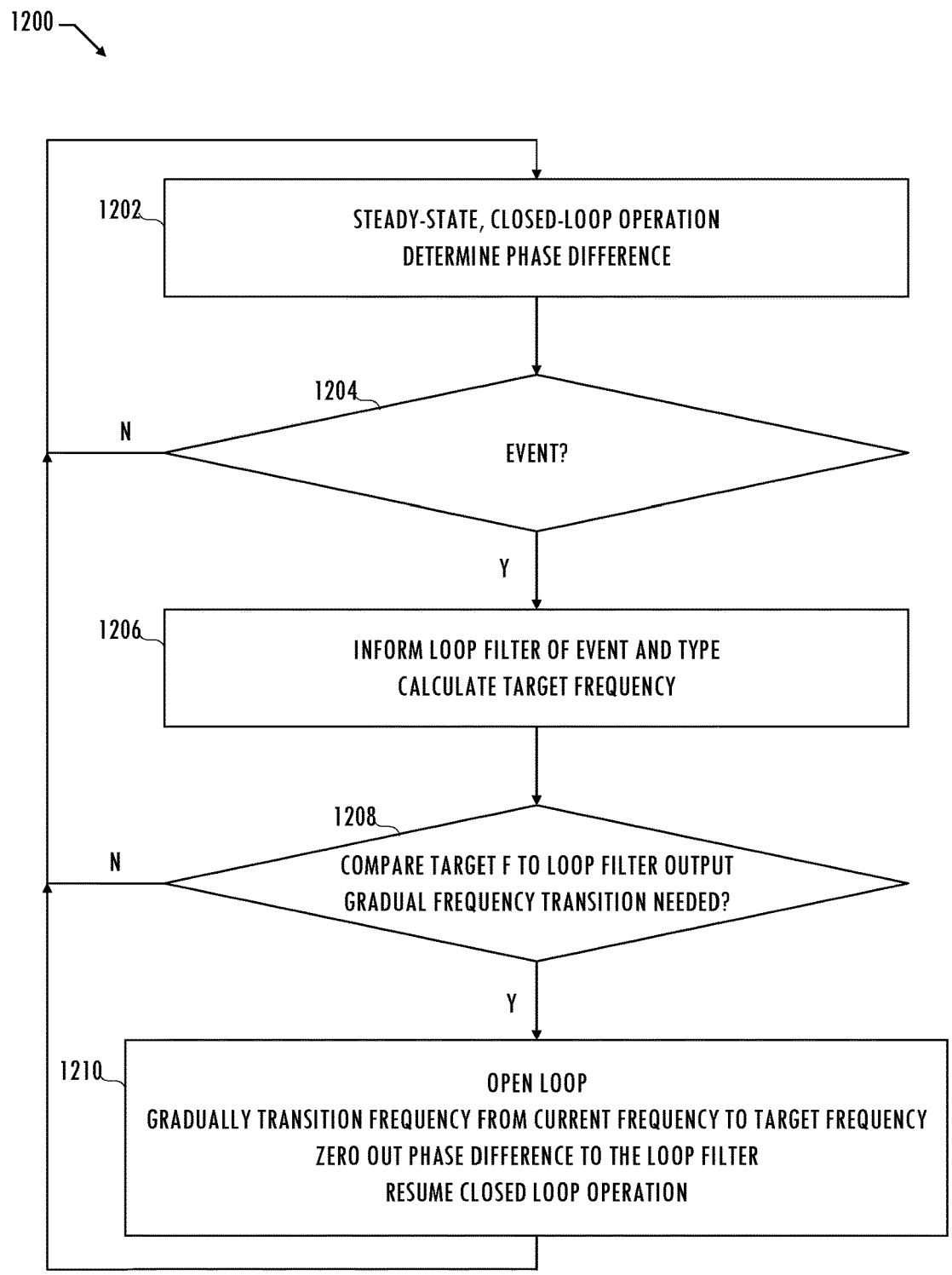
FIG. 11 illustrates exemplary information and control flows for operation of the clock generator circuit of FIG. 2 consistent with at least one embodiment of the invention.

Referring to FIGS. 2, 10, and 11, in at least one embodiment, event/holdover controller 224 generates control signals to configure clock generator 104 consistent with information and control flow 1200. While clock generator 104 operates in closed-loop operation, phase/frequency detector 158 updates an output phase difference value (1202). Event/holdover controller 224 determines whether an event has occurred (e.g., loss-of-signal event, out-of-frequency event, phase error event, etc.) based on digital values for input clock signal CLKIN(N:1), feedback clock signal FBCLK, and predetermined threshold levels (e.g., threshold OOF_THRESH, threshold PM_THRESH. threshold LOS_THRESH) (1204). In the absence of detection of an event that causes rearrangement clock generator 104, event/holdover controller 224 maintains clock generator 104 in closed-loop operation (1202). If event/holdover controller 224 detects an event, event/holdover controller 224 identifies the type of event, and initiates rearrangement of clock generator 104 in response to the event. Event/holdover controller 224 determines a target value FREQ_TARGET based on calculation of a target frequency (1206).

Frequency target calculator 123 determines whether rearrangement of clock generator 104 should include a frequency transition of a frequency step based on a comparison of the magnitude of a difference between target value FREQ_TARGET and the loop filter output to threshold RAMP_THRESH, which is a predetermined transition threshold value (1208). If frequency target calculator 123 determines that a gradual frequency transition is not needed (e.g., the difference is less than the predetermined transition threshold value and the difference is within the bandwidth of outer phase-locked loop 204), then outer phase-locked loop 204 continues to operate in a closed-loop configuration (1202). If frequency target calculator 123 determines that a gradual frequency transition should occur (e.g., the difference is greater than the predetermined transition threshold value) with or without a frequency step, then event/holdover controller 224 opens outer phase-locked loop 204 and configures change-limiting loop filter 120 as described in FIG. 7 to gradually transition the frequency of output clock signal CLKOUT from the current frequency to a target frequency and to align the phase, as described above. Referring to FIG. 11, after output clock signal CLKOUT achieves the target frequency, event/holdover controller 224 saves the value of the output of phase/frequency detector 158 in storage element 153 and then makes the output of phase/frequency detector 158 equal zero by adding the phase difference stored in storage element 153 to the output of time-to-digital converter 152. Then, event/holdover controller 224 configures outer phase-locked loop 204 to resume closed-loop operation (1210) and closed-loop operation continues (1202). The information and control flows of FIG. 11 are exemplary only and other embodiments of clock generator 104 use other sequences of steps or additional steps that do not affect data dependencies.

In general, predetermined values (e.g., phase slope limit, frequency slope limit, predetermined step, and threshold values) may be fixed during manufacture or production test of clock product 100 or may be defined by a user. As referred to herein, a user is an application (e.g., configuration software) executing on a processor (e.g., executing on controller 102 or a controller external to clock product 100) to configure clock product 100 or clock generator 104, or a person manually configuring clock product 100 for operation. Thus, techniques for a clock product handling of relatively large changes in frequency of an active input clock signal have been described. Techniques described herein improve phase continuity or reduce amount of open-loop operation in some applications.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. For example, while the invention has been described in an embodiment in which clock generator 104 uses a dual-loop phase-locked loop, one of skill in the art will appreciate that the teachings herein can be utilized with clock generators including other numbers of cascaded phase-locked loops. In addition, although the invention has been described in an embodiment in which outer phase-locked loop 204 of clock generator 104 controls the divider value used by divider 118 of inner loop 108 and output divider 166 receives divider control signal DIVP, one of skill in the art will appreciate that the teachings herein can be utilized with outer phase-locked loop 204 controlling divider control signal DIVP of an output divider responsive to CLKVCO and divider 118 is responsive to a predetermined divider value.

The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A method for generating a clock signal by a phase-locked loop comprising:
   generating a phase difference signal based on an input clock signal and a feedback clock signal; and
   generating a loop filter output signal, wherein in a first mode of operation, the loop filter output signal is generated based on the phase difference signal and a predetermined frequency slope limit, the clock signal being generated based on the loop filter output signal.

2. The method, as recited in claim 1, wherein in the first mode of operation, generating the loop filter output signal comprises:
   generating a phase-slope-limited version of the phase difference signal based on a predetermined phase slope limit; and
   generating a frequency-slope-limited version of the phase difference signal based on the predetermined frequency slope limit,
   wherein the loop filter output signal is generated using the phase-slope-limited version of the phase difference signal and the frequency-slope-limited version of the phase difference signal.

3. The method, as recited in claim 1, wherein in a second mode of operation, the loop filter output signal is generated based on the predetermined frequency slope limit, a value of the loop filter output signal, and a target frequency.

4. The method, as recited in claim 3, wherein in the second mode of operation, the loop filter output signal is generated further based on a predetermined frequency step value.

5. The method, as recited in claim 4, wherein a first magnitude of the predetermined frequency step value is less than or equal to a second magnitude of a predetermined phase slope limit.

6. The method, as recited in claim 3, wherein in the second mode of operation, generating the loop filter output signal comprises:
   initializing contents of an accumulator to an initialization value; and
   updating the contents of the accumulator with a combination of the contents of the accumulator and an operand based on the target frequency and the predetermined frequency slope limit in the second mode of operation,
   wherein the loop filter output signal is based on the contents of the accumulator.

7. The method, as recited in claim 6, wherein the initialization value is the value of the loop filter output signal.

8. The method, as recited in claim 6, wherein generating the loop filter output signal in the second mode of operation further comprises:
   combining the value of the loop filter output signal and a predetermined frequency step value to generate the initialization value.

9. The method, as recited in claim 3, wherein the first mode of operation is closed-loop operation of the phase-locked loop and the second mode of operation is an open-loop operation of the phase-locked loop, the method further comprising:
   operating the phase-locked loop in the second mode of operation;
   after a frequency of the clock signal gradually transitions to the target frequency, zeroing the phase difference signal; and
   after zeroing the phase difference signal, operating the phase-locked loop in the first mode of operation.

10. A phase-locked loop comprising:
    a phase-detector configured to generate a phase difference signal in response to an input clock signal and a feedback clock signal; and
    a change-limiting loop filter, wherein in a first mode of operation, the change-limiting loop filter is configured to generate a loop filter output signal based on a predetermined frequency slope limit and the phase difference signal.

11. The phase-locked loop, as recited in claim 10, wherein in a second mode of operation, the change-limiting loop filter is configured to generate the loop filter output signal based on the predetermined frequency slope limit, a value of the loop filter output signal, and a target frequency.

12. The phase-locked loop, as recited in claim 11, wherein the change-limiting loop filter comprises:
    an accumulator configured to update contents of the accumulator with a combination of an operand and the contents of the accumulator;
    a frequency slope limiting circuit configured to provide the operand to the accumulator, wherein in the second mode of operation, the operand is based on the predetermined frequency slope limit and the target frequency; and
    a low-pass filter, wherein in the second mode of operation, the low-pass filter is configured to generate the loop filter output signal based on the contents of the accumulator.

13. The phase-locked loop, as recited in claim 12, wherein in the second mode of operation, the accumulator is configured to receive the value of the loop filter output signal as an initialization value.

14. The phase-locked loop, as recited in claim 12, wherein in the second mode of operation the accumulator is configured to receive an initialization value that is a combination of the loop filter output signal and a predetermined frequency step value.

15. The phase-locked loop, as recited in claim 14, wherein a first magnitude of the predetermined frequency step value is less than or equal to a second magnitude of a predetermined phase slope limit.

16. The phase-locked loop, as recited in claim 10, wherein the change-limiting loop filter further comprises:
    a frequency slope limiting circuit;
    a phase slope limiting circuit;
    a combining circuit; and
    a low-pass filter,
    wherein in the first mode of operation, the frequency slope limiting circuit is configured to generate a frequency-slope-limited version of the phase difference signal based on the predetermined frequency slope limit, the phase slope limiting circuit is configured to generate a phase-slope-limited version of the phase difference signal based on a predetermined phase slope limit signal, the combining circuit is configured to generate a change-limited signal based on the phase-slope-limited version of the phase difference signal and the frequency-slope-limited version of the phase difference signal, and the combining circuit is configured to generate the loop filter output signal based on the change-limited signal.

17. A method for operating a phase-locked loop, the method comprising:
    in response to an event, gradually changing a frequency of an output clock signal generated by the phase-locked loop from a first frequency to a second frequency, the frequency being gradually changed at a rate less than or equal to a predetermined frequency slope limit,
    wherein the first frequency is based on a prior frequency of the output clock signal and a predetermined frequency step value, and
    wherein the frequency of the output clock signal is a continuous function of time including a linear frequency change between the first frequency and the second frequency and including a nonlinear frequency change between a third frequency and the first frequency, a difference between the third frequency and the first frequency having a magnitude based on the predetermined frequency step value.

18. The method, as recited in claim 17, further comprising:
    receiving from a user an indication of the predetermined frequency step value,
    wherein a first magnitude of the predetermined frequency step value is less than or equal to a second magnitude of a predetermined phase slope limit, and wherein the event is initial lock to an available input clock signal, entrance into holdover mode, exit from holdover mode, or change of input clock signal provided to the phase-locked loop.

19. The method, as recited in claim 17, further comprising:
    after the frequency of the output clock signal gradually changes to the second frequency, zeroing a phase difference signal of the phase-locked loop; and
    after zeroing the phase difference signal, resuming a closed-loop mode of operating the phase-locked loop.

* * * * *

UNITED STATES PATENT AND TRADEMARK OFFICE
CERTIFICATE OF CORRECTION

PATENT NO.         : 10,693,475 B1
APPLICATION NO.    : 16/427837
DATED              : June 23, 2020
INVENTOR(S)        : Xue-Mei Gong and James D. Barnette It is certified that error appears in the above-identified patent and that said Letters Patent is hereby corrected as shown below:

On page 2, Column 2, after Line 11, please insert:
--2015/0222280 A1 8/2015 Allan et al.--

Signed and Sealed this
Twentieth Day of October, 2020

Andrei Iancu
*Director of the United States Patent and Trademark Office*